(12) United States Patent
Shaheed et al.

(10) Patent No.: US 6,870,179 B2
(45) Date of Patent: Mar. 22, 2005

(54) INCREASING STRESS-ENHANCED DRIVE CURRENT IN A MOS TRANSISTOR

(75) Inventors: M. Reaz Shaheed, Portland, OR (US); Thomas Hoffmann, Hillsboro, OR (US); Mark Armstrong, Portland, OR (US); Christopher P. Auth, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/404,880

(22) Filed: Mar. 31, 2003

(65) Prior Publication Data

US 2004/0188670 A1 Sep. 30, 2004

(51) Int. Cl.[7] .............................................. H01L 29/06
(52) U.S. Cl. .......................................... 257/29; 257/18
(58) Field of Search .............................. 257/18, 20, 29

(56) References Cited

U.S. PATENT DOCUMENTS

| | | | |
|---|---|---|---|
| 6,228,694 B1 | | 5/2001 | Doyle et al. |
| 6,362,082 B1 | | 3/2002 | Doyle et al. |
| 6,399,973 B1 | * | 6/2002 | Roberds ..................... 257/288 |
| 6,605,498 B1 | * | 8/2003 | Murthy et al. .............. 438/197 |
| 2004/0026765 A1 | * | 2/2004 | Currie et al. ............... 257/616 |
| 2004/0145019 A1 | * | 7/2004 | Dakshina-Murthy et al. .... 257/ |

349
2004/0157353 A1 * 8/2004 Ouyang et al. ............... 438/38

OTHER PUBLICATIONS

U.S. Appl. No. 10/112,170, filed Mar. 29, 2002, Doyle et al. (Application), Patent No. 6,605,498.
U.S. Appl. No. 09/895,579, filed Jun. 29, 2001, Doyle et al. (Application), Patent No. 6,717,213.
U.S. Appl. No. 09/727,296, filed Nov. 29, 2000, Thompson et al. (Application).
U.S. Appl. No. 09/752,333, filed Dec. 29, 2000, Doyle et al. (Application), Patent No. 6,563,152.
Shimizu, A. et al., *Local Mechanical–Stress Control (LMC): A New Technique for CMOS–Performance Enhancement*, Hitachi ULSI Systems, Co., Ltd, Tokyo, Japan (2001).
Ito, Shinya et al., *Mechanical Stress Effect of Etch–Stop Nitride and its Impact on Deep Submicron Transistor Design*, ULSI Device Development Div., NEC Corp. (2000).

* cited by examiner

*Primary Examiner*—David Nelms
*Assistant Examiner*—Thao P. Le
(74) *Attorney, Agent, or Firm*—Blakely, Sokoloff, Taylor & Zafman LLP

(57) ABSTRACT

An intentional recess or indentation is created in a region of semiconductor material that will become part of a channel of a metal oxide semiconductor (MOS) transistor structure. A layer is created on a surface of the recess to induce an appropriate type of stress in the channel.

8 Claims, 4 Drawing Sheets

```
┌─────────────────────────────────────────────┐
│  Create At Least One Recessed Region, On One Or │
│  Opposite Sides Of A Region Of Semiconductor    │
│  Material That Will Become Part Of A Channel Of A│
│     NMOS Transistor Structure. 304              │
└─────────────────────────────────────────────┘
                      │
                      ▼
┌─────────────────────────────────────────────┐
│  Create A Layer On The Surface Of The Recessed  │
│  Regions, To Induce Tensile Stress In The Channel In│
│  A length Direction Of The Structure And Compressive│
│     Stress In The Vertical Direction. 308       │
└─────────────────────────────────────────────┘
                      │
                      ▼
┌─────────────────────────────────────────────┐
│    A Region Of Semiconductor Material That Will │
│   Become The Source And/Or Drain Of A p—Channel │
│      MOS(PMOS) Structure, In The Same Integrated│
│    Circuit Die Or In The Same Semiconductor Wafer,│
│       Is Covered By A Suitable Layer. 312       │
└─────────────────────────────────────────────┘
                      │
                      ▼
┌─────────────────────────────────────────────┐
│  An Additional Layer, Such As The First Interlayer│
│    Dielectric (ILD0) Layer, Is Created On A Surface│
│     Of The Layer Formed In Block 308. 316       │
└─────────────────────────────────────────────┘
```

Fig. 4

INCREASING STRESS-ENHANCED DRIVE CURRENT IN A MOS TRANSISTOR

BACKGROUND

The embodiments of the invention relate to techniques for mechanically stressing the channel of a metal oxide semiconductor (MOS) transistor structure, to yield enhanced drive current.

A MOS transistor is the basic building block of digital, integrated circuit components such as processors and memory. The MOS transistor is often described as a three terminal device, with metal lines being provided to its source and drain semiconductor regions and its gate electrode. These lines are part of patterned, metal layers of an integrated circuit die and are insulated from each other via interlayer dielectrics. When used as a switch, the MOS transistor is "turned on" when its drive current in a so-called channel region, between its source and drain regions, is enabled via a voltage applied to its gate electrode.

One way to achieve faster switching of a MOS transistor is to design the device so that the mobility and velocity of its charge carriers in the channel region are increased. An appropriate type of stress in the channel region of an n-channel metal oxide semiconductor (NMOS) transistor is known to improve carrier mobility and velocity, which results in increased drive current for the transistor.

Tensile stress in a lateral direction may be obtained by forming a nitride etch stop layer inside the first layer of inter-layer dielectric (also referred to as ILD0) to create stress in the channel that lies directly below the etch stop layer. See Ito et al., "Mechanical Stress Effect of Etch-Stop Nitride and Its Impact on Deep Submicron Transistor Design", IEDM-2001, pp. 433–436. To achieve increased drive current via increased carrier mobility and velocity, thicker nitride layers may be used to meet higher, specified stress levels. However, thicker nitride layers can present manufacturing difficulties as well as reliability concerns.

Another technique for obtaining tensile stress in a MOS transistor is to build the transistor structure in a silicon substrate that has been grown on top of a relaxed SiGe buffer layer. The buffer layer pulls the silicon layer above it, to induce tensile stress in the silicon layer. This structure, however, may require a relatively complex and expensive manufacturing process.

BRIEF DESCRIPTION OF THE DRAWINGS

The embodiments of the invention are illustrated by way of example and not by way of limitation in the figures of the accompanying drawings in which like references indicate similar elements. It should be noted that references to "an" embodiment of the invention in this disclosure are not necessarily to the same embodiment, and they mean at least one.

FIG. 4 is a flow diagram of an example process for manufacturing the stressed channel MOS transistor with recessed source/drain regions.

An intentionally recessed region is created in a region of semiconductor material that is to become part of a channel of a MOS transistor structure. A layer is created on a surface on the recessed region to induce tensile stress in the channel. Other embodiments are also described.

DETAILED DESCRIPTION

Figure 1:
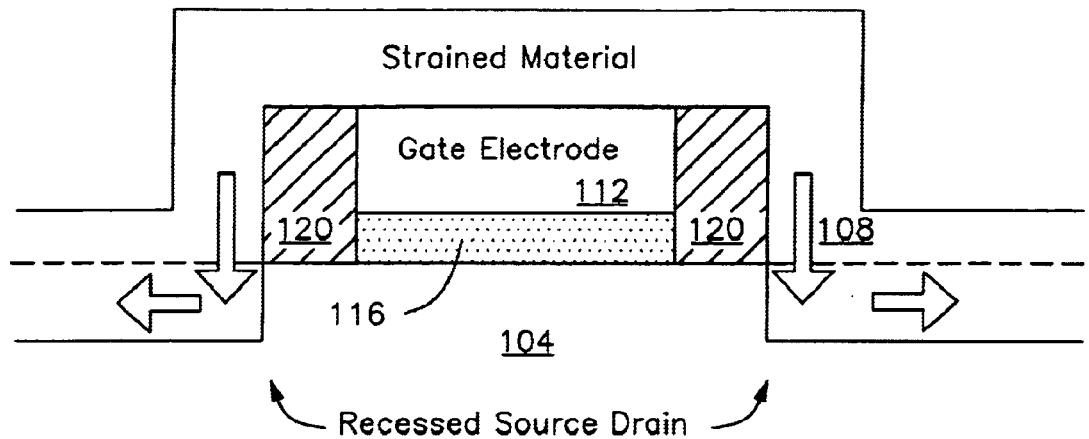
FIG. 1 is a diagram of an example MOS transistor structure having a mechanically stressed channel with recessed source/drain regions.

FIG. 1 is a diagram of an example MOS transistor structure having a mechanically stressed channel with recessed source and drain regions. A region 104 of semiconductor material is part of the channel of the transistor. The region 104 has recessed portions as shown, along a width direction of the structure, i.e. perpendicular to the plane of the figure. The source and drain regions of the transistor structure may be formed within the recessed portions. A layer 108 of strained material may be in contact with and conforming to a surface of the recessed portions.

The recessed portions may allow the layer 108 to induce more tensile stress in the channel, in the length direction of the transistor structure indicated by the arrows (also known as the lateral direction), and more compressive stress in the vertical direction, as compared to a planar topology depicted by the dotted lines. Perhaps that is because the layer 108 has a relatively small volume of the channel material to pull. Accordingly, the same level of stress as that of a planar structure may be obtained, but with an advantageously thinner layer 108. The laterally tensile and vertically compressive stress is expected to increase the drive current, particularly in a NMOS transistor structure in which the material of the region 104 is a p-type semiconductor (e.g. doped silicon). Note that recessing just one of the source and drain regions may also work to improve drive current.

FIG. 1 also shows a gate stack formed on a top surface of the region 104. In this embodiment, the layer 108 is also in contact with and conforms to a surface of the gate stack, along both the width and length directions of the transistor structure. The gate stack in this case includes a gate electrode 112 on a top surface of a gate dielectric 116. The material of the gate electrode 112 may be polysilicon or metal, while that of the gate dielectric 116 may be an oxide, an oxynitride, or a high-K dielectric. In certain embodiments, such as a polycide fabrication process, spacers 120 are used to protect the gate stack from being shorted to the source and/or drain metal contacts during manufacture. However, an embodiment without the spacers may also work.

Figure 2:
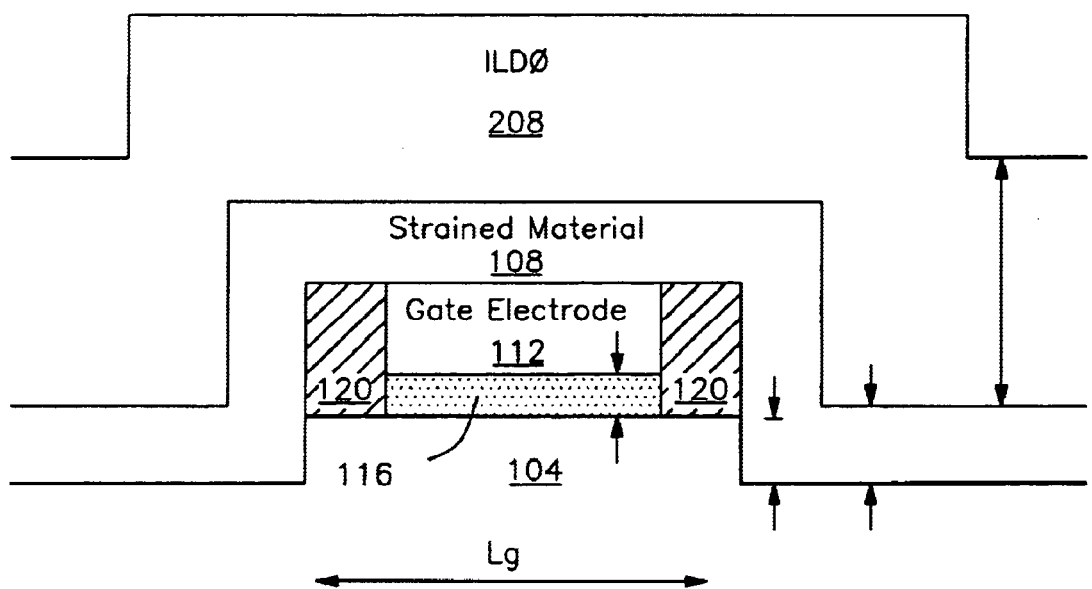
FIG. 2 is a diagram of the stressed channel MOS transistor that points out examples of certain dimensions.

Turning now to FIG. 2, a diagram of the stressed channel MOS transistor is shown that points out certain dimensions (using the arrow pairs shown). In this example, the first interlayer dielectric (ILD0) layer 208 of the integrated circuit die is also shown, in contact with and conforming to a surface of the strained material layer 108. As an example, note how much thicker ILD0 is than the strained material layer 108. According to an embodiment of the invention, the strained material layer is between five hundred (500) and two thousand (2000) angstroms thick.

FIG. 2 also indicates a depth dimension of the recessed portions. The distance between the horizontal surfaces of the recessed portions and a top surface of the region 104 may intentionally be designed to be in the range three hundred to one thousand (300–1000) angstroms. Note how the recessed portions have a steep drop. In contrast, a conventional MOS transistor structure with planar source and drain regions may have an "incidental" recess or sag in the source/drain regions that is much less steep, and may drop no more than two hundred and fifty (250) angstroms. FIG. 2 also shows the thickness dimensions of the gate electrode 112, ILD0 208, and gate dielectric 116—these may be sized according to conventional, digital MOS transistor structures, particularly those of less than one hundred (100) nanometers gate length, Lg.

Figure 3:
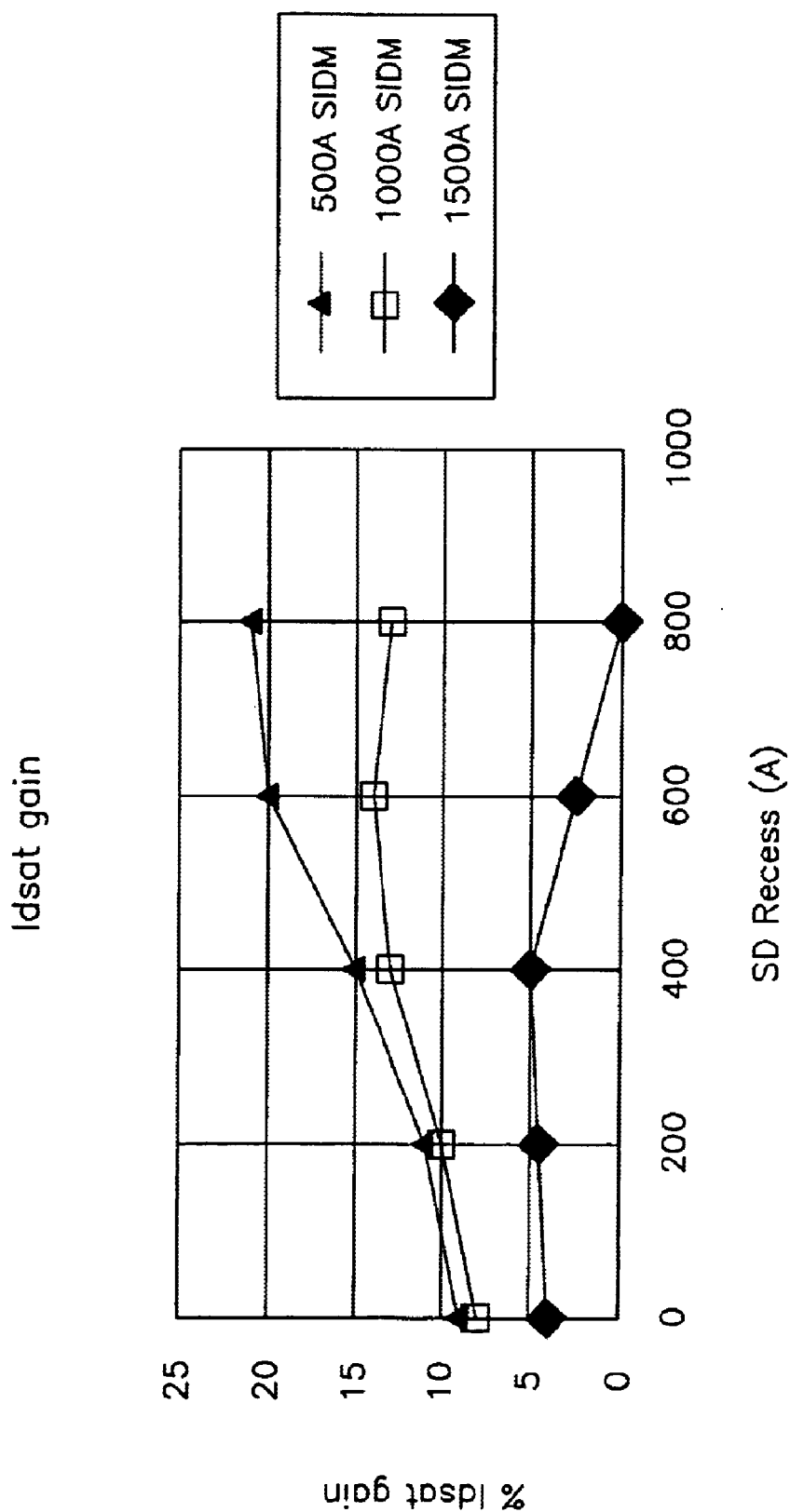
FIG. 3 is a plot of simulation data depicting drive current gain vs. recess depth, for transistors having three different thickness of strained interlayer dielectric material (SIDM).

An advantage of the stressed channel MOS transistor structure described above may be appreciated by studying FIG. 3. This figure is a plot of simulation data depicting drive current gain vs. recess depth, for stressed channel MOS transistors of the type described above, having three different thickness of strained interlayer dielectric material (SIDM) as the layer 108 (see FIGS. 1 and 2). The SIDM film may be a conventional nitride etch stop layer (NESL) film, or it may be one that exhibits more intrinsic stress than NESL. The plot shows that by aggressively recessing the source and drain regions, in this case more than five hundred (500) angstroms, significant increases in drive current (represented by saturation drain current, or Idsat for short) can be obtained. The plot also suggests that thicker SIDM films will also improve drive current.

A process for manufacturing the stressed channel MOS transistor structure is described in the flow diagram of FIG. 4. The process may be a modified form of a conventional, MOS fabrication process for either a bulk device or a semiconductor on insulator (SOI) device. The process involves creating at least one recessed region, on one or opposite sides of a region of semiconductor material that will become part of a channel of a NMOS transistor structure (block 304). This can be done by etching the semiconductor material, down to the desired depth. Although not mentioned explicitly in the diagram of FIG. 4, conventional operations such as the formation of the source and drain implants or diffusions may either precede or follow the formation of the recessed regions.

Next, a layer is created on the surface of the recessed regions, to induce tensile stress in the channel in a length direction of the structure (block 308). As mentioned above, this strain layer may be a NESL film or other strained insulating film, which pulls the semiconductor material on which it has been created, in the length direction of the transistor structure.

In some cases, such as in a complementary MOS process flow, a region of semiconductor material that will become the source and/or drain of a p-channel MOS (PMOS) structure, in the same integrated circuit die or in the same semiconductor wafer, may be covered by a suitable layer prior to forming the strain layer in block 308 (block 312). This layer is designed to help avoid inducing tensile stress in the channel of PMOS transistor structures via the strain layer, because tensile stress might not promote higher carrier mobility and velocity in such transistor structures.

Finally, an additional layer, such as the first interlayer dielectric (ILD0) layer, may be created, e.g. via deposition or sputtering, on a surface of the layer formed in block 308 (block 316). This layer serves to separate the metal layers that form the integrated circuit. The variations mentioned above in connection with FIGS. 1–3 may be readily implemented in such a fabrication process.

Figure 5:
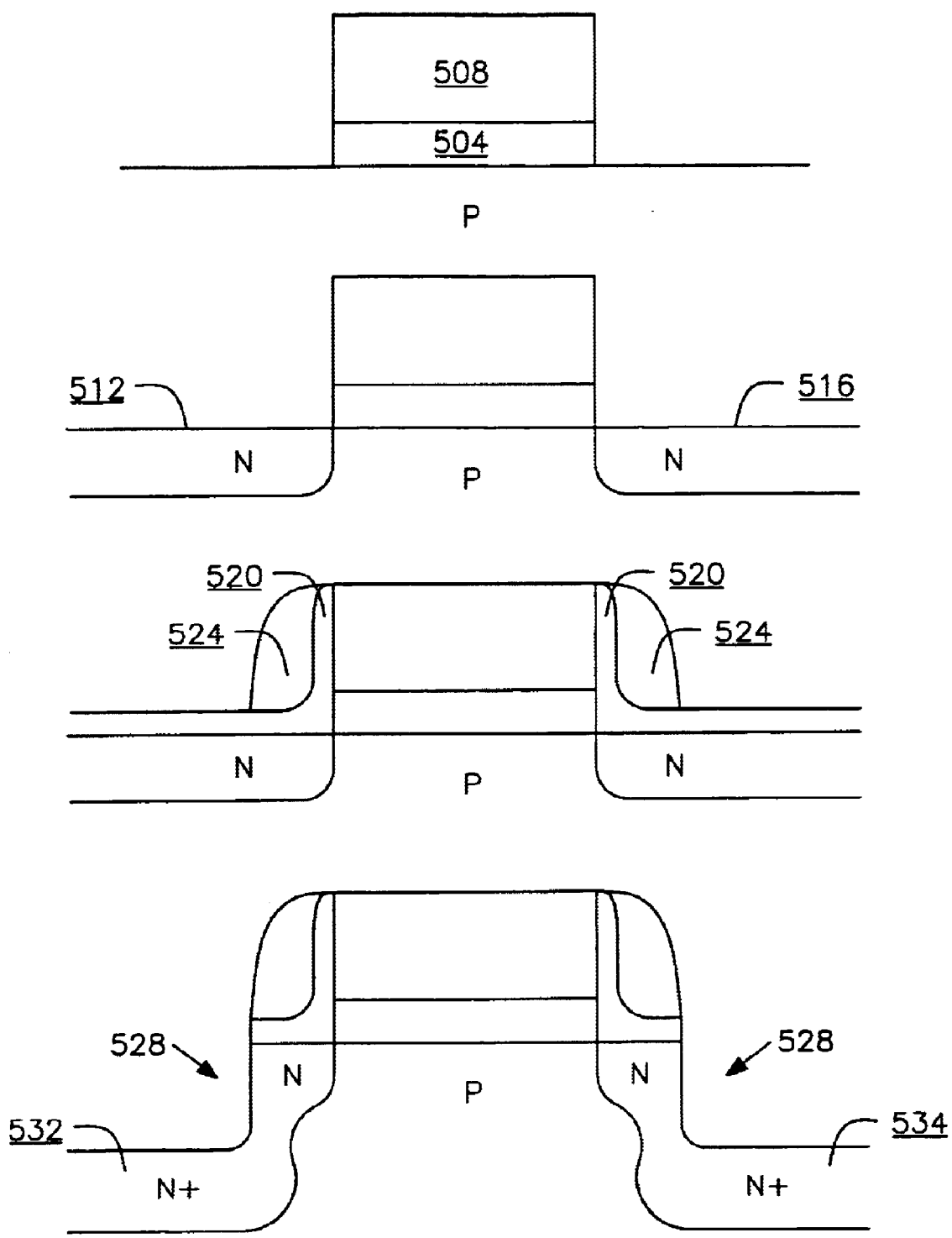
FIG. 5 is a diagram of some stages of an example manufacture of the stressed channel MOS transistor with recessed source/drain regions.

FIG. 5 is a diagram of some stages of the stressed channel MOS transistor with recessed source and drain regions, during its process of being manufactured. Other manufacturing processes can alternatively be used to obtain the desired stressed channel MOS structure. This particular process begins with the formation of part of the gate stack, including gate dielectric 504 and gate electrode 508. Next, lightly doped, n-type drain and source regions 512, 516 are formed on opposite sides of the gate stack, via, for example, an implant process. Thereafter, a thin, oxide liner 520 is formed, followed by spacers 524. The spacers 524 are used to block the formation of a silicide (not shown) on the exposed semiconductor surfaces, which may include a gate electrode 508 made of polysilicon. Next, the recessed regions 528 are formed, in this case on both sides of the channel region that lies underneath the gate stack. Higher doped (N+) source and drain regions 532, 534 may then be formed, followed by an annealing operation to diffuse the high and low doped source/drain regions together as shown. Finally, a strained layer (e.g. a NESL film) is created on the vertical surfaces, and on at least some of the horizontal surfaces of the recessed regions 528. This will induce mechanical stress, in the semiconductor region that lies underneath the gate stack, in a length direction as well as a vertical direction of the transistor structure.

Note that a recessed portion should be deep enough to increase the tensile stress (using the strain layer that is formed on its surface) to improve drive current. However, in some cases, the recessed portion, including its depth, shape, and doping concentration, may need to be carefully engineered so as to increase carrier mobility and/or velocity in the channel, without a significant increase in source/drain resistance.

To summarize, various embodiments of a MOS transistor structure with improved stress-enhanced drive current, together with different embodiments of a process for its manufacture, have been described. In the foregoing specification, the invention has been described with reference to specific exemplary embodiments thereof. It will, however, be evident that various modifications and changes may be made thereto without departing from the broader spirit and scope of the invention as set forth in the appended claims.

What is claimed is:

1. A device comprising:
   a region of semiconductor material that will become part of a channel of a MOS transistor structure, said region having opposing recessed portions that run along a width direction of the transistor structure; and
   a strained dielectric layer in contact with and conforming to surfaces of the recessed portions.

2. The device of claim 1 further comprising:
   a gate stack formed on a top surface of the region of semiconductor material, wherein the strained dielectric layer is in contact with and conforms to a top surface of the gate stack along the width direction.

3. The device of claim 2 wherein the gate stack includes a gate electrode layer on top of a gate dielectric layer.

4. The device of claim 3 wherein the gate stack further includes spacers.

5. The device of claim 2 further comprising:
   an interlayer dielectric (ILD) layer in contact with and conforming to a surface of the strained dielectric layer.

6. The device of claim 5 wherein the ILD layer is thicker than the strained dielectric layer.

7. The device of claim 1 wherein the strained dielectric layer is between 500 to 2000 angstroms thick.

8. The device of claim 7 wherein horizontal surfaces of the recessed regions are between 300 and 1000 angstroms below a top surface of said semiconductor region.

* * * * *